(12) United States Patent
Straayer et al.

(10) Patent No.: US 12,308,853 B1
(45) Date of Patent: May 20, 2025

(54) HIGH PERFORMANCE TIME-TO-DIGITAL CONVERTER

(71) Applicant: Advanced Micro Devices, Inc., Santa Clara, CA (US)

(72) Inventors: Matthew Straayer, Boxborough, MA (US); Lyn Mark Elzinga, Folsom, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 139 days.

(21) Appl. No.: 18/194,371

(22) Filed: Mar. 31, 2023

(51) Int. Cl.
*H03M 1/50* (2006.01)
*H03M 1/38* (2006.01)
*H03L 7/06* (2006.01)
*H03M 1/06* (2006.01)
*H03M 1/18* (2006.01)

(52) U.S. Cl.
CPC ............. *H03M 1/50* (2013.01); *H03M 1/38* (2013.01); *H03L 7/06* (2013.01); *H03M 1/0604* (2013.01); *H03M 1/182* (2013.01)

(58) Field of Classification Search
CPC ........ H03M 1/50; H03M 1/38; H03M 1/0604; H03M 1/182; H03L 7/06
See application file for complete search history.

(56) References Cited

U.S. PATENT DOCUMENTS

2014/0266353 A1* 9/2014 Tang .................... G04F 10/005
327/159

* cited by examiner

*Primary Examiner* — Joseph J Lauture
(74) *Attorney, Agent, or Firm* — Greenberg Traurig, LLP

(57) ABSTRACT

The disclosed high-performance time-to-digital converter (TDC) incorporates ratiometric signal quantization with correlated double sampling (CDS). The TDC includes an input voltage circuit that outputs an input voltage signal and a fractional reference voltage circuit that outputs a fractional reference voltage signal. The TDC also includes a quantizer circuit that provides a differential output of the input voltage signal and the fractional reference voltage signal as a digital time value. Various other methods, systems, and computer-readable media are also disclosed.

20 Claims, 5 Drawing Sheets

HIGH PERFORMANCE TIME-TO-DIGITAL CONVERTER

BACKGROUND

Various circuits and computing components often rely on oscillating signals to synchronize and operate together. Various control circuits, such as a phase-locked loop (PLL), are used for controlling a frequency and/or phase of oscillating signals, for example by adjusting an oscillator to match the phase of a periodic input signal. A digital phase-locked loop (DPLL) uses a digitally controlled oscillator (DCO) along with a time-to-digital converter (TDC) for phase detection in a digital domain. However, the TDC often contributes to in-band DPLL phase noise.

BRIEF DESCRIPTION OF THE DRAWINGS

The accompanying drawings illustrate a number of exemplary implementations and are a part of the specification. Together with the following description, these drawings demonstrate and explain various principles of the present disclosure.

Figure 1:
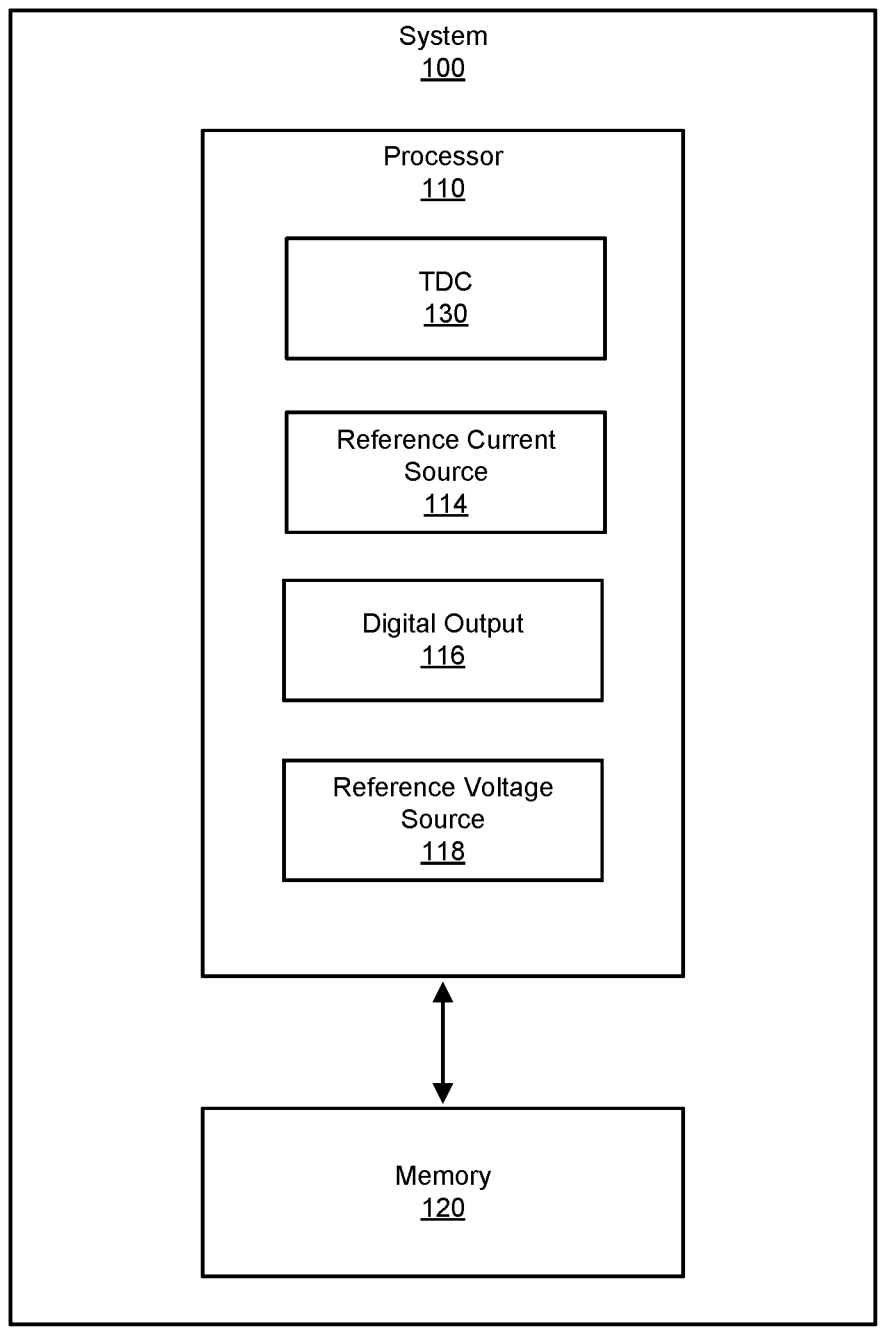
FIG. 1 is a block diagram of an exemplary system for a high performance time-to-digital converter (TDC).

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the present disclosure covers all modifications, equivalents, and alternatives falling within the scope of the appended claims.

DETAILED DESCRIPTION

The present disclosure is generally directed to a high performance TDC. As will be explained in greater detail below, implementations of the present disclosure provide a TDC with ratiometric scaling using an input time sampling circuit and a fractional reference time sampling circuit that enables correlated double sampling (CDS). The systems and methods described herein advantageously provides a high-resolution, low-power, and high-sampling rate TDC which can improve performance (e.g., via noise reduction to achieve high spectral purity) of DPLLs and related circuits.

In one implementation, a time-to-digital converter (TDC) includes an input voltage circuit configured to translate input time to an input voltage signal, a reference voltage circuit configured to translate a reference time to a reference voltage signal, a fractional reference voltage circuit configured to output a fractional reference voltage signal corresponding to a fractional portion of the reference voltage signal, and a quantizer circuit configured to output a digital value representing a difference between the input signal and the fractional reference voltage signal.

In some examples, the input voltage circuit includes a first current element, and the reference voltage circuit comprises a second current element. In some examples, the input voltage circuit includes a first capacitor array coupled to the first current element and the first current element is configured to charge the first capacitor array, and the reference voltage circuit includes a second capacitor array coupled to the second current element and the second current element is configured to charge the second capacitor array. In some examples, the first current element is the second current element.

In some examples, the fractional reference voltage circuit includes a primary capacitor array and a sacrificial capacitor array, the fractional reference voltage circuit is configured to connect the reference voltage signal to capacitors of the primary capacitor array based on a fractional digital code, and the fractional reference voltage circuit is configured to connect the reference voltage signal to capacitors of the sacrificial capacitor array corresponding to capacitors of the primary capacitor array not connected to the reference voltage signal.

In some examples, a capacitance of a capacitor array of the input voltage circuit matches a total capacitance of the connected capacitors of the primary capacitor array and the connected capacitors of the sacrificial capacitor array.

In some examples, the fractional reference voltage circuit is configured to output the fractional reference voltage signal based on a fractional digital code from the quantizer circuit. In some examples, the quantizer circuit includes a comparator. In some examples, the quantizer circuit comprises a successive approximation register (SAR) logic circuit.

In some examples, a second reference voltage signal used by the quantizer circuit to scale quantization is in linear proportion to the reference voltage signal. In some examples, the TDC further includes a digital-to-analog converter (DAC) circuit comprising a resistor ladder or a bridge capacitor.

In one implementation, a device for a high performance TDC includes a TDC for receiving an input time and outputting a digital time value. The TDC includes a time sampling circuit having a first current element and a positive primary capacitor array configured to output an input voltage signal, and a fractional time sampling circuit configured to output a fractional voltage signal. The fractional time sampling circuit includes a second current element, and a negative primary capacitor array. The TDC also includes an ADC circuit configured to output a difference between the time voltage signal and the fractional voltage signal as the digital time value.

In some examples, the first current element is the second current element. In some examples, the ADC includes a successive approximation register (SAR) logic circuit that is configured to output a fractional digital code. In some examples, the fractional time sampling circuit includes a sacrificial capacitor array and is configured to connect the second current element to capacitors of the negative primary capacitor array corresponding to the fractional digital code and connect the second current element to capacitors of the sacrificial capacitor array corresponding to capacitors of the negative primary capacitor array not connected to the current element.

In one implementation, a method for ratiometric scaling and CDS for a TDC includes translating an input time signal to an input voltage signal for a time-to-digital converter (TDC), translating a reference time signal to a fractional reference voltage signal, and quantizing, using an analog-to-digital converter (ADC) of the TDC, a difference between the input voltage signal and the fractional reference voltage signal to a digital word, wherein the digital word comprises a linear function of the time input signal.

In some examples, translating the input time signal to the input voltage signal includes integrating a reference current onto a first capacitor array for an input time corresponding to the input time signal to produce the input voltage signal.

In some examples, translating the reference time signal to the fractional reference voltage signal includes integrating the reference current onto a fractional portion of a second capacitor array for a reference time corresponding to the reference time signal to produce the fractional reference voltage signal, wherein a remainder portion of the first capacitor array is not connected to the reference current, and integrating the reference current onto a portion of a third capacitor array corresponding to the remainder portion of the first capacitor array.

In some examples, a capacitance of the first capacitor array is similar to a combined capacitance of fractional portion of the second capacitor array and the portion of the third capacitor array. In some examples, quantizing the difference between the input voltage signal and the fractional reference voltage signal to the digital word includes providing the ADC a differential output of the input voltage signal and the fractional reference voltage signal.

Features from any of the implementations described herein can be used in combination with one another in accordance with the general principles described herein. These and other implementations, features, and advantages will be more fully understood upon reading the following detailed description in conjunction with the accompanying drawings and claims.

The following will provide, with reference to FIGS. 1-5, detailed descriptions of high performance TDCs. Detailed descriptions of example systems and circuits are provided in connection with FIGS. 1-3. Detailed descriptions of correlated double sampling are provided in connection with FIG. 4. Detailed descriptions of corresponding computer-implemented methods will also be provided in connection with FIG. 5.

FIG. 1 is a block diagram of an example system 100 for a DPLL having a TDC. System 100 corresponds to a computing device, such as a desktop computer, a laptop computer, a server, a tablet device, a mobile device, a smartphone, a wearable device, an augmented reality device, a virtual reality device, a network device, and/or an electronic device. As illustrated in FIG. 1, system 100 includes one or more memory devices, such as memory 120. Memory 120 generally represents any type or form of volatile or non-volatile storage device or medium capable of storing data and/or computer-readable instructions. Examples of memory 120 include, without limitation, Random Access Memory (RAM), Read Only Memory (ROM), flash memory, Hard Disk Drives (HDDs), Solid-State Drives (SSDs), optical disk drives, caches, variations, or combinations of one or more of the same, and/or any other suitable storage memory.

As illustrated in FIG. 1, example system 100 includes one or more physical processors, such as processor 110. Processor 110 generally represents any type or form of hardware-implemented processing unit capable of interpreting and/or executing computer-readable instructions. In some examples, processor 110 accesses and/or modifies data and/or instructions stored in memory 120. Examples of processor 110 include, without limitation, microprocessors, microcontrollers, Central Processing Units (CPUs), graphics processing units (GPUs), Field-Programmable Gate Arrays (FPGAs) that implement softcore processors, Application-Specific Integrated Circuits (ASICs), systems on chip (SoCs), digital signal processors (DSPs), Neural Network Engines (NNEs), accelerators, graphics processing units (GPUs), portions of one or more of the same, variations or combinations of one or more of the same, and/or any other suitable physical processor. In some examples, processor 110 corresponds to any control circuit, such as a PLL, DPLL, etc.

As further illustrated in FIG. 1, processor 110 includes a TDC 130, a reference current source 114, a digital output 116, and a reference voltage source 118. TDC 130 corresponds to a high performance TDC, for instance capable of converting a ratio of input time divided by reference time into a digital word as well as achieve correlated double sampling (CDS) of reference time error sources as described herein. Reference current source 114 corresponds to a current source or any other source for a reference current for producing an input voltage. Digital output 116 corresponds to a digital output of TDC 130, e.g., a digital time value. Reference voltage source 118 corresponds to a reference feedback voltage (e.g., from an ADC and/or successive approximation register (SAR) ADC as described herein).

Figure 2:
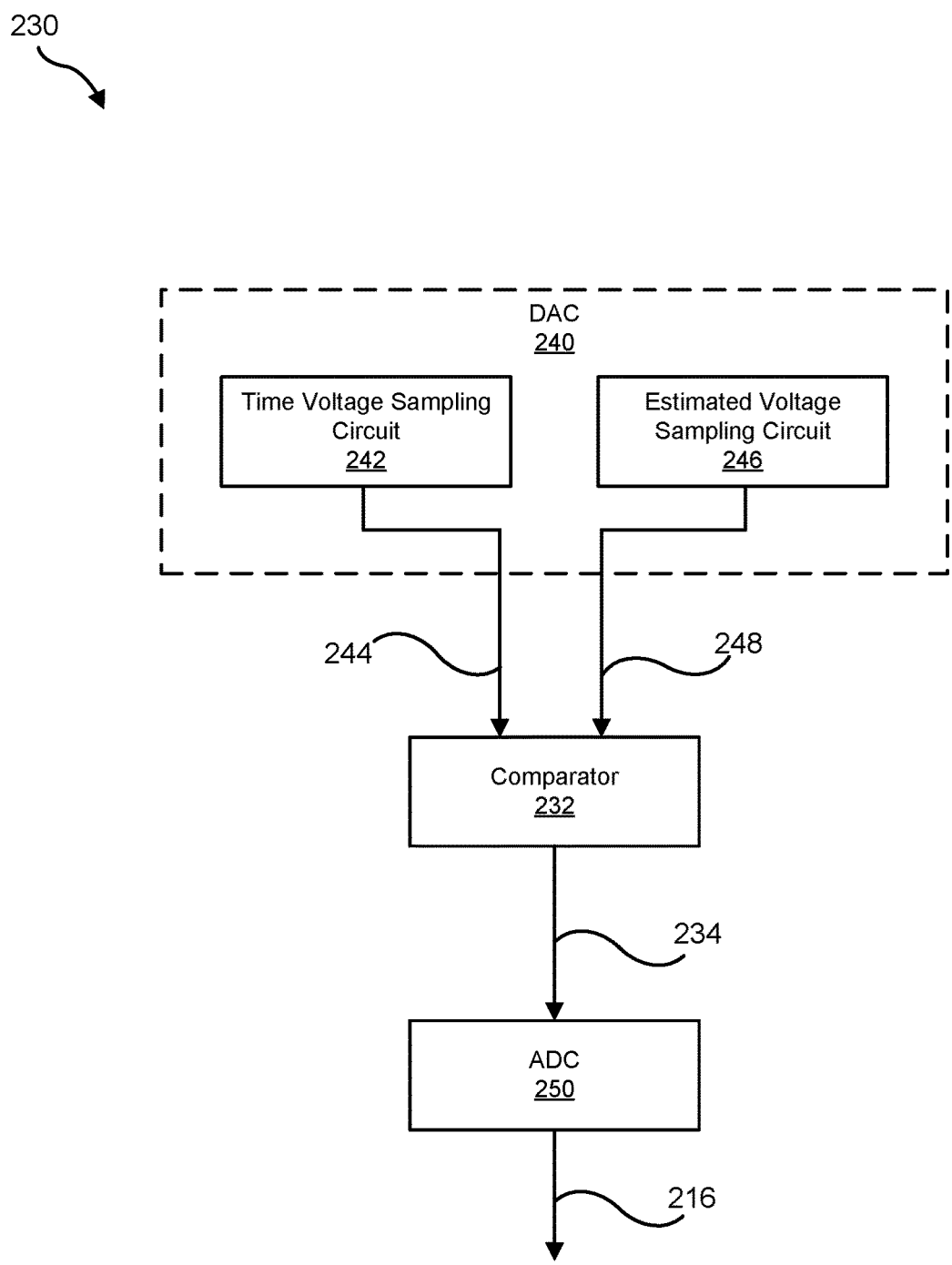
FIG. 2 is a simplified block diagram of a TDC.

FIG. 2 illustrates an example TDC 230 that corresponds to TDC 130. As illustrated in FIG. 2, TDC 230 includes an input voltage circuit 242 and a fractional reference voltage circuit 246 that, in some examples, can be part of a digital-to-analog converter (DAC) 240. Input voltage circuit 242 (e.g., an input voltage sampling circuit) outputs an input voltage signal 244 (e.g., based on an input time) and fractional reference voltage circuit 246 (e.g., a reference voltage sampling circuit) outputs a fractional reference voltage signal 248 (e.g., a fractional portion of a reference voltage signal based on a reference time) to a quantizer circuit 250. Quantizer circuit 250, which in some examples can correspond to an analog-to-digital converter (ADC), includes a comparator 232 and a successive approximation register (SAR) logic 252. Comparator 232 outputs a differential output 234 (of input voltage signal 244 and fractional reference voltage signal 248) to SAR logic 252, which outputs a digital time value 216 that corresponds to digital output 116.

TDC 230 allows ratiometric scaling of an input time by a reference time. Input voltage circuit 242 samples and holds an input voltage (e.g., input voltage signal 244 corresponding to the input time) and fractional reference voltage circuit 246 samples and holds a reference voltage (e.g., fractional reference voltage signal 248 corresponding to the reference time, and in some examples corresponding to a fractional portion of the reference voltage). Comparator 232 provides differential output 234 to SAR logic 252, which outputs digital time value 216. In addition, as will be described further below, TDC 230 allows correlated double sampling (CDS) of time values to provide further noise reduction.

Figure 3:
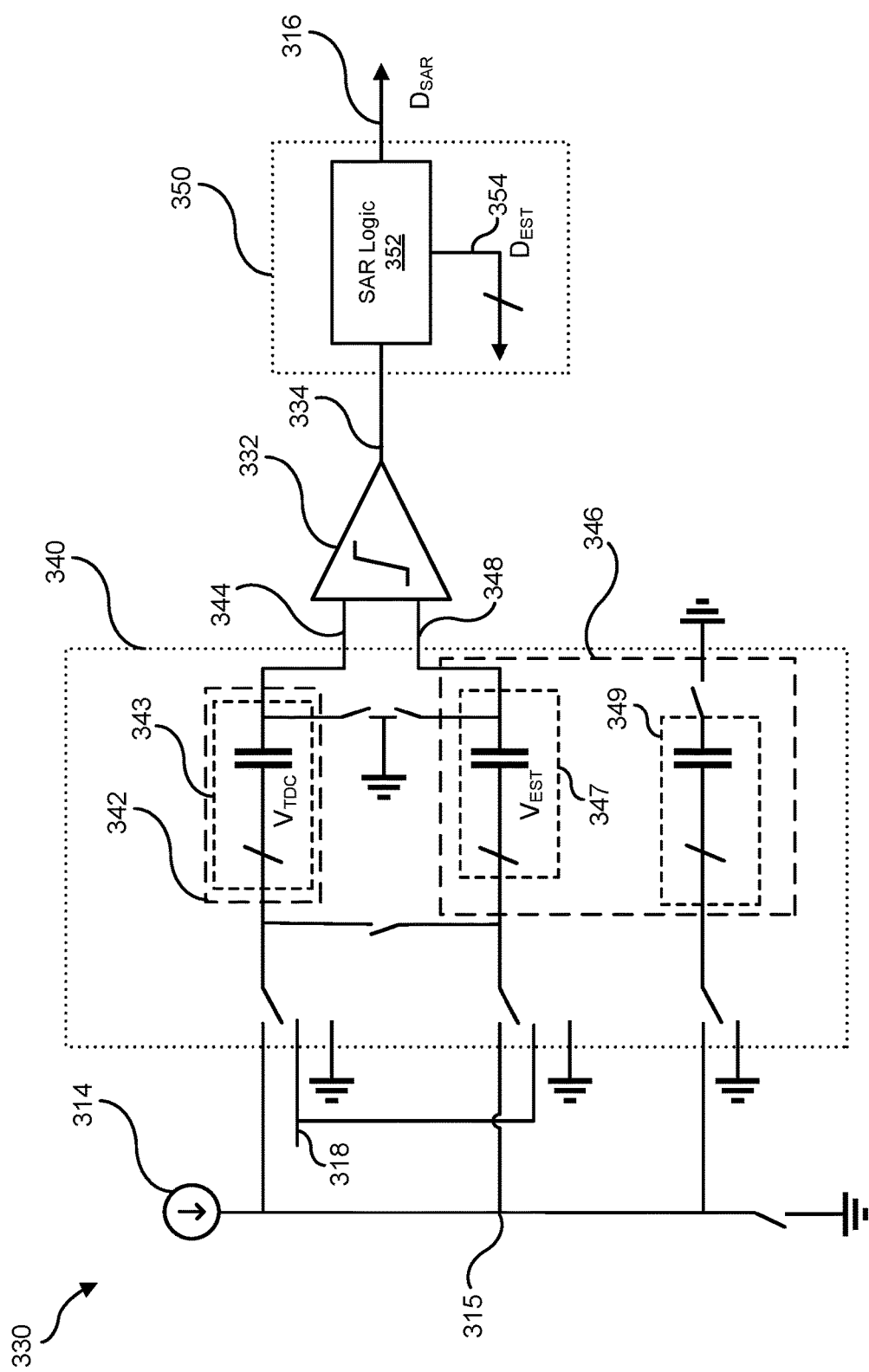
FIG. 3 is a simplified circuit diagram of a TDC.

FIG. 3 illustrates an example TDC 330 that corresponds to TDC 230 and/or TDC 130. As illustrated in FIG. 3, TDC 330 includes a current source 314 that corresponds to reference current source 114, and an input voltage 315. TDC 330 also includes a reference voltage 318 that corresponds to reference voltage source 118. TDC 330 further includes, in some implementations, a DAC 340 that corresponds to digital-to-analog converter (DAC) 240. TDC 330 (e.g., DAC 340) can include a time sampling circuit 342 that corresponds to input voltage circuit 242 and a fractional time sampling circuit 346 that corresponds to fractional reference voltage circuit 246. Time sampling circuit 342 outputs an input voltage signal 344 (that corresponds to input voltage signal 244) and fractional time sampling circuit 346 outputs a fractional voltage signal 348 (that corresponds to fractional reference voltage signal 248) to an ADC 350 (that corresponds to quantizer circuit 250). ADC 350 includes a comparator 332 that corresponds to comparator 232. Comparator 332 outputs a differential output 334 (that corresponds to differential output 234) of input voltage signal 344 and fractional voltage signal 348 to a SAR logic 352 (that corresponds to SAR logic 252). ADC 350 outputs a digital time value 316 that corresponds to digital time value 216 and/or digital output 116.

FIG. 3 further illustrates example implementations of time sampling circuit 342 and fractional time sampling circuit 346 for providing ratiometric scaling and CDS. In one example, input voltage 315 is sampled and held in time sampling circuit 342 by connecting current source 314 to time sampling circuit 342 for a time period corresponding to an input time period (e.g., having a phase error). A timing for samples is further described with reference to FIG. 4.

Figure 4:
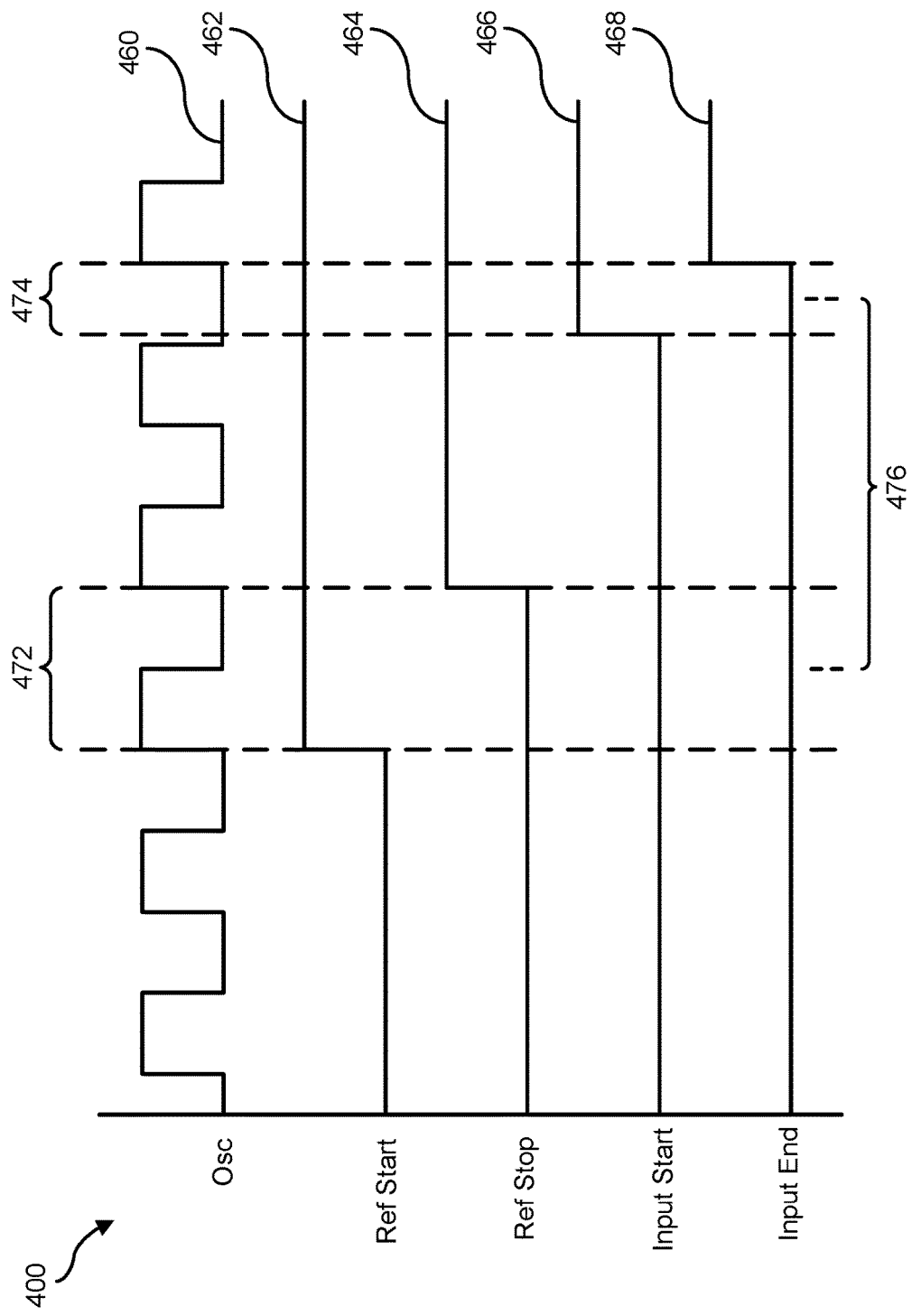
FIG. 4 is a signal diagram of correlated double sampling.

FIG. 4 illustrates a signal timing diagram 400 for a DPLL and/or a TDC, such as TDC 230 and/or TDC 330. FIG. 4 includes an oscillator signal 460 corresponding to a clock signal (e.g., a digital oscillator of TDC 230 and/or TDC 330). An input time period 474 can be triggered and/or otherwise defined by an input start signal 466 (e.g., a rising or changing edge thereof) and an input end signal 468 (e.g., a rising or changing edge thereof). Input start signal 466 can correspond to a PLL timing reference and input end signal 468 can correspond to a PLL feedback. Input time period 474 can exhibit a phase error, illustrated in FIG. 4 as misalignment with the edges of oscillator signal 460.

Returning to FIG. 3, time sampling circuit 342 includes a positive primary capacitor array 343 (e.g., for providing a positive input to comparator 332) of a particular capacitance, such as $2^{N-1} C_U$. By connecting current source 314 (e.g., input voltage 315) to positive primary capacitor array 343 for the input time period, the capacitors of positive primary capacitor array 343 can store a charge or voltage (e.g., $V_{TDC}$) relating to the input time period such that time sampling circuit 342 can provide input voltage signal 344 that corresponds to the input time period.

Fractional time sampling circuit 346 includes a negative primary capacitor array 347 (e.g., for providing a negative input to comparator 332) and a sacrificial capacitor array 349. In some examples, each of negative primary capacitor array 347 and sacrificial capacitor array 349 can have a same capacitance (e.g., $2^{N-1}C_U$ where N corresponds to a resolution or number of bits for ADC 350) as positive primary capacitor array 343. To perform ratiometric scaling, fractional time sampling circuit 346 can provide fractional voltage signal 348 to comparator 332 that relates to a reference time.

In FIG. 4, a reference time period 472 corresponds to a period of oscillator signal 460 (e.g., a time between rising edges). Reference time period 472 can be triggered and/or otherwise defined by a reference start signal 462 (e.g., a rising or changing edge thereof) and a reference end signal 464 (e.g., a rising or changing edge thereof). By connecting, for example, current source 314 (e.g., input voltage 315) to fractional time sampling circuit 346, the capacitors of estimated voltage sampling circuit 346 can store a charge relating to the reference time period such that fractional time sampling circuit 346 can provide fractional voltage signal 348 that corresponds to the reference time period.

In some implementations, ADC 350 can correspond to a successive approximation register (SAR) ADC that includes SAR logic 352. SAR logic 352 can use a series of comparisons of a reference voltage (e.g., reference voltage 318) to a sampled input, adjusted in binary increments (corresponding to combinations of the capacitance), to determine each bit of a converted output result. Each bit corresponds to a binary portion of a total reference voltage of ADC 350. For example, the first bit represents the upper or lower 0.5 of the reference voltage (achieved by differentially applying voltages to segments of the capacitor arrays), the second bit representing the next upper or lower half (e.g., 0.25 offset), and so forth. With successive approximations using a digital estimate $D_{EST}$ (e.g., a fractional digital code 354), the bits of a digital output of the SAR, $D_{SAR}$ (e.g., digital time value 316) can be determined. Thus, $D_{SAR}$ corresponds to a ratio of the differential input voltages with respect to the total reference voltage for ADC 350. $D_{SAR}$ also relates to the actual digital code for the TDC input ($D_{TDC}$) in the following equation:

$$D_{TDC} = D_{EST} + D_{SAR} \qquad \text{Equation 1}$$

The corresponding voltages further relate based on the following equation:

$$V_{TDC} = V_{EST} + V_{rand} \qquad \text{Equation 2}$$

where $V_{rand}$ corresponds to random portions of $V_{TDC}$ (e.g., noise, variance, etc.) and $V_{EST}$ corresponds to a deterministic or estimated voltage from SAR logic 352. Thus, to better isolate and measure $V_{rand}$, fractional time sampling circuit 346 is configured to provide $V_{EST}$ such that comparator 332 compares $V_{TDC}$ with $V_{EST}$.

FIG. 3 illustrates one implementation of fractional time sampling circuit 346 utilizing sacrificial capacitor array 349 to achieve $V_{EST}$ as the input (as fractional voltage signal 348) to comparator 332. SAR logic 352 provides fractional digital code 354 (e.g., $D_{EST}$) to fractional voltage sampling circuit 346 such that fractional time sampling circuit 346 outputs fractional voltage signal 348 based on fractional digital code 354.

In some examples, fractional time sampling circuit 346 connects input voltage 315 to negative primary capacitor array 347 and sacrificial capacitor array 349 based on fractional digital code 354 by connecting portions or segments of negative primary capacitor array 347 and/or sacrificial capacitor array 349 to input voltage 315, and the capacitors not connected to input voltage 315 are connected to a ground. A total number of connected capacitors in fractional time sampling circuit 346 can correspond to a same capacitance (e.g., $2^{N-1}C_U$) as positive primary capacitor array 343. For instance, fractional time sampling circuit 346 can connect input voltage 315 to $D_{EST}$ capacitors of negative primary capacitor array 347 and connect input voltage 315 to $2^{N-1} - D_{EST}$ (e.g., corresponding to capacitors of negative primary capacitor array 347 not connected to input voltage 315) capacitors of sacrificial capacitor array 349 for the reference time.

Accordingly, negative primary capacitor array 347 is charged with a fraction of the voltage corresponding to $V_{EST}$ and the remainder can be discarded with sacrificial capacitor array 349, which is not connected to comparator 332. In other words, the charged capacitors of negative primary capacitor array 347 and sacrificial capacitor array 349 together can hold the reference voltage, whereas only a fractional portion of the reference voltage (e.g., as held by the capacitors of negative primary capacitor array 347) is provided to ADC 350. Further, in some examples, this reference voltage is in linear proportion to a reference voltage signal used by ADC 350 to scale quantization, in order to provide ratiometric scaling. However, in other implementations, a fractional time sampling circuit (e.g., fractional reference voltage circuit 246) can include a circuit to null out the unwanted remainder of the reference voltage, rather than sampling the remainder onto a sacrificial capacitor array. In yet other examples, a fractional time sampling circuit (e.g., fractional reference voltage circuit 246) can charge a capacitor array for a fraction of the reference time to achieve the desired fractional reference voltage.

Comparator 332 accordingly provides differential output 334 (e.g., a difference) of $V_{TDC}$ and $V_{EST}$ to ADC 350 (e.g., SAR logic 352). SAR logic 352 can use differential output 334 for determining $D_{SAR}$ (e.g., digital time value 316) as well as $D_{EST}$ (e.g., estimated digital code 354) as described herein.

By using the various capacitor arrays as described herein (e.g., positive primary capacitor array 343, negative primary capacitor array 347, and sacrificial capacitor array 349), TDC 330 can provide ratiometrically scaled output as well as CDS. For example, the differential inputs of input voltage signal 344 and fractional voltage signal 348 can provide ratiometric scaling, and the sampling of $V_{EST}$ as one of the differential inputs further provides CDS. To better ensure correlation between the two sample inputs, a time offset between the samples can be within a sample time threshold. For instance, in FIG. 4, a sample time offset 476 (e.g., a time between midpoints of reference time period 472 and input time period 474) can be within the sample time threshold.

FIG. 3 illustrates one implementation of a TDC. In other implementations, although not illustrated in FIG. 3, DAC 340 can include various other circuits and/or components, such as a resistor ladder, a bridge capacitor, etc. Moreover, although FIG. 4 illustrates reference time period 472 (and its corresponding sampling) before input time period 474 (and its corresponding sampling), in other examples, the sampling can occur in any order and/or can change order.

Figure 5:
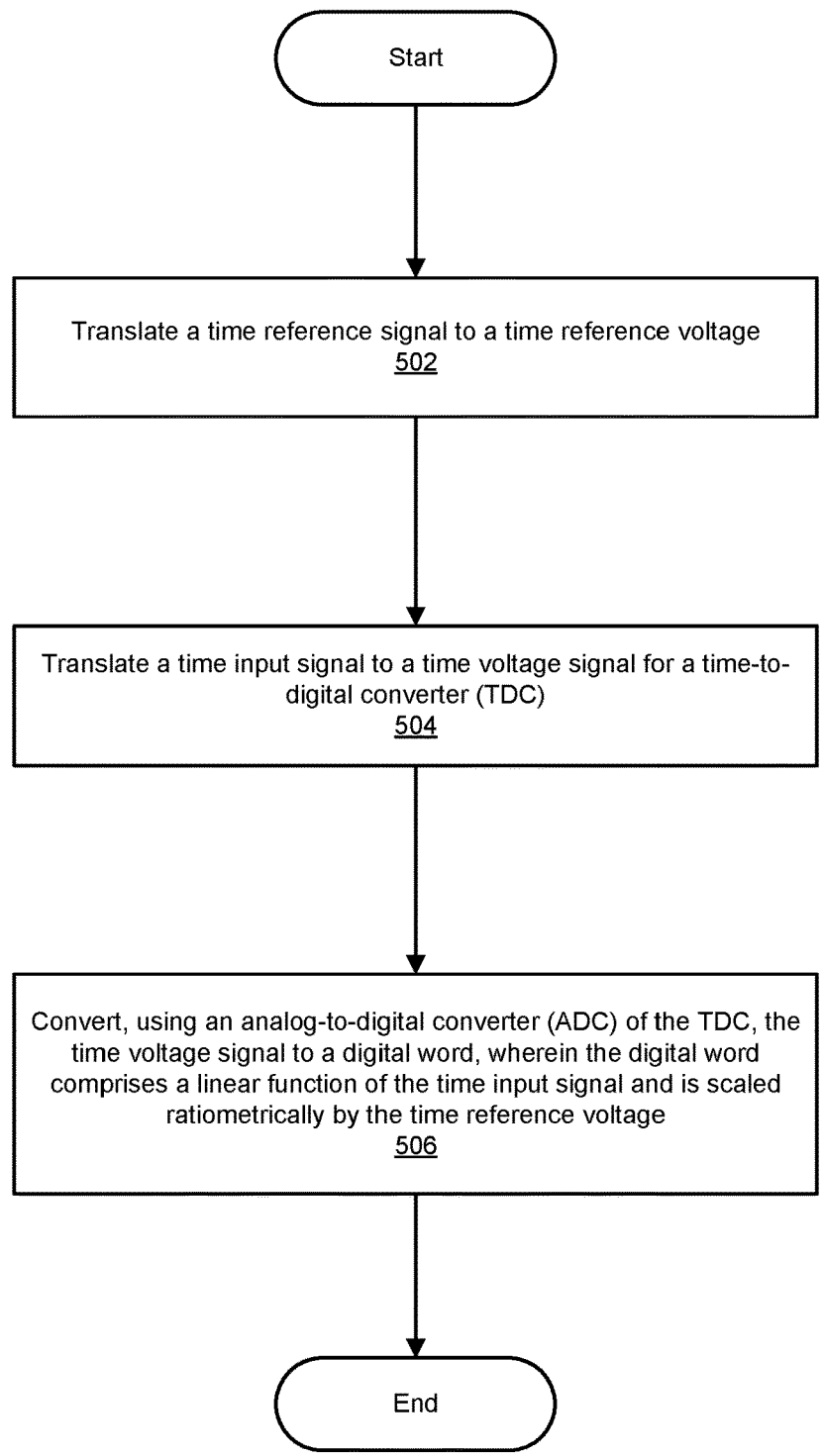
FIG. 5 is a flow diagram of an exemplary method for using a ratiometric TDC with correlated double sampling (CDS).

FIG. 5 is a flow diagram of an exemplary method 500 for ratiometric scaling and CDS for a TDC. The steps shown in FIG. 5 can be performed by any suitable circuit, including the system(s) illustrated in FIGS. 1, 2, and/or 3. In one example, each of the steps shown in FIG. 5 represent an algorithm whose structure includes and/or is represented by multiple sub-steps, examples of which will be provided in greater detail below.

As illustrated in FIG. 5, at step 502 one or more of the systems described herein translate an input time to an input voltage signal for a TDC. For example, input voltage circuit 242 can translate an input time to input voltage signal 244.

The systems described herein can perform step 502 in a variety of ways. In one example, translating the input time to the input voltage includes integrating the reference current (e.g., current source 314) onto a capacitor array (e.g., positive primary capacitor array 343).

At step 504 one or more of the systems described herein translate a reference time signal to a fractional reference voltage signal. For example, fractional reference voltage circuit 242 can translate a reference time signal to fractional reference voltage signal 248.

The systems described herein can perform step 504 in a variety of ways. In one example, translating the reference time signal to the fractional reference voltage signal can include integrating a reference current (e.g., current source 314) onto a capacitor array (e.g., negative primary capacitor array 347 and sacrificial capacitor array 349) to produce the reference time voltage and maintaining an estimated portion of the time reference voltage (e.g., $V_{EST}$) to produce an estimated voltage signal (e.g., by discarding an unwanted portion via sacrificial capacitor array 349). In other examples, translating the reference time signal to the fractional reference voltage signal can include integrating the reference current onto a fractional portion of a capacitor array (e.g., a fractional portion of negative primary capacitor array 347 based on fractional digital code 354) and integrating the reference current onto a portion of another capacitor array (e.g., sacrificial capacitor array 349 corresponding to capacitors of negative primary capacitor array that were not connected to current source 314). In yet other examples, translating the reference time signal to the fractional reference voltage signal can include integrating the reference current onto a capacitor array and nulling out an unwanted portion/remainder from the charged capacitor array.

At step 506 one or more of the systems described herein quantize, using an ADC of the TDC, a difference between the input voltage signal and the fractional reference voltage signal to a digital word. The digital word corresponds to a linear function of the time input signal and is scaled ratiometrically by the time reference voltage. For example, quantizer circuit 250 converts, by way of differential output 234 from comparator 232, the input time signal into digital time value 216.

The systems described herein can perform step 506 in a variety of ways. In one example, quantizing the difference between the input voltage signal and the fractional reference voltage signal to the digital word includes providing the ADC (e.g., ADC 350 and/or SAR logic 352) a differential output (e.g., differential output 334) of the input voltage signal (e.g., input voltage signal 344) and the fractional reference voltage signal (e.g., fractional voltage signal 348).

As detailed above, an exemplary TDC includes a first circuit configured to sample a signal proportional to an input time, a second circuit configured to sample an estimate signal proportional to both a reference time and a fractional estimate of the reference time, and an ADC configured to quantize the difference of the first and second sampled signals. In some implementations, elements of the first and second sampling circuits are shared and can be utilized for translating time to the first and/or second sampled signals.

In some implementations, the translation from time to voltage for both first and second signals includes a shared current element that charges capacitance. Moreover, the first sampling circuit also includes a first capacitive array that is connected to the current element to translate time to a first sampled signal, and the second sampling circuit includes a second capacitive array that is connected to the same current element to translate reference time and a fractional estimate to a second sampled signal. The switches between capacitive elements, the current element, supply and/or reference voltages, and numerous other components can have numerous configurations in other examples. Further, the sequence of time translation to the first and second signals can occur in either order with deterministic, pseudo-random, or random patterns.

In some implementations, the first capacitive array can form in whole or in part the positive capacitive digital-to-analog converter (CDAC) of a successive approximation register (SAR) ADC and the second capacitive array can form in whole or in part a negative CDAC for the same SAR ADC. With the positive CDAC and negative CDAC in communication with a differential comparator, the comparator decisions, combinatorial logic, and DAC codes can be configured to result in a quantization of the difference between the first and second sampled signals. Other forms of analog-to-digital conversion such as pipeline, sigma-delta, zero-crossing, single-slope, or alternatives can also be used.

In some implementations, a fractional estimate of the reference time is input to the TDC and configured to provide an estimated digital code to the second estimate sampling circuit. The estimate sampling circuit is configured to either sample a fraction of a reference signal based on the estimated digital code or otherwise present a fraction of the reference signal to the ADC for quantization (e.g., by nulling out an unwanted fraction of the reference signal). Further, the capacitance array connected to a current element during the reference time signal translation can be separated into a first fractional capacitance that is based on the estimated digital code and a second fractional capacitance that is also based on the estimated digital code. It may be desirable to have the two fractional capacitances summing together to an approximately fixed amount of capacitance that is connected to the current element regardless of the estimated digital code.

In some implementations, the first fractional capacitance samples a signal proportional to the reference time and a fractional estimate, and the signal sampled on the second fractional capacitance is not presented to the ADC for quantization of the signal difference. In other examples, other permutations and combinations of ways to have a constant capacitance presented to the current element can accomplish this function. In addition, the second fractional capacitance that does not present a signal to the ADC can be formed in many ways, for example by using the first capacitance array prior to sampling the first input signal, by using the full second capacitance array and then nullifying out the signal on a fractional number of capacitive elements, with a third capacitance array in addition to the first and second capacitance arrays, etc.

During the period where a reference time is translated into a reference signal, capacitive elements in the first fractional capacitive array and/or second fractional capacitance array not connected to the current element can be connected to a constant voltage such as ground or disconnected from the sampling circuits entirely.

In some implementations, the ADC includes a DAC circuit implemented with the first input sampling circuit and the second estimate sampling circuit. Further, the DAC circuits can include numerous means to accomplish quantization, such as bridge capacitors and capacitive arrays, parallel capacitive arrays, voltage reference and voltage reference dividers circuits, buffers, voltage supplies, switches, amplifiers, comparators, and other circuits common in state-of-the-art ADC.

In some implementations, a device for a high performance TDC includes an ADC for receiving input and reference signals and outputting a digital value corresponding with the ratio of the input to the reference time signals input to the TDC. The TDC includes a current element, a first sampling circuit including a positive primary capacitor array configured to sample a first input signal, a second sampling circuit including a negative primary capacitor array configured to sample a second estimated signal, and optionally a third sacrificial capacitor array, and switches configured to charge the capacitor arrays according to the input and reference time signals as well as the estimated digital code. The TDC also includes a comparator circuit configured to provide a differential output of the first input signal and the second estimate signal and logic circuitry configured to output the digital time value from the differential output of the comparator circuit.

In some implementations, the ADC includes a successive approximation register (SAR) logic circuit that is configured to provide an estimated digital code to the second estimated sampling circuit. In some examples, the estimated voltage sampling circuit is configured to connect the reference signal to the first fractional capacitance in the negative primary capacitor array and to the second fractional capacitance in a sacrificial capacitor array based on the estimated digital code. In some examples, the sacrificial capacitor array can be formed with the first, second, or optionally third capacitance array.

In some implementations, translating the reference time signal to the reference voltage includes integrating a reference current onto a capacitor array for a reference time to produce the reference voltage. The reference signal can be used to define a fractional estimate signal by effectively combining the fractional estimate with the reference signal. The charge on capacitors and voltage on capacitors are equivalent for the purposes described herein and can be used interchangeably. In some examples, translating the time input signal to the input voltage signal includes integrating the reference current onto a capacitor array similar to the capacitor array used for translating the time reference signal.

In some examples, converting the time voltage signal to the digital word includes providing the ADC a differential output of the input signal and the estimate signal. The final digital output of the TDC can be a logical or mathematical combination of the estimate digital word and the ADC digital word.

In one example, a method for ratiometric scaling and CDS for a TDC includes (i) translating a time input signal to a voltage input signal, (ii) translating a time reference signal to a voltage reference signal, (iii) translating a reference voltage signal to a fractional estimate signal based on a digital estimate value, and (iv) using an ADC to convert the input signal to a digital word, such that the digital word comprises a linear function of the time input signal and is scaled ratiometrically by the time reference voltage. An extension to this method can include translating a time input signal to a voltage input signal and a time reference signal to a voltage reference signal using shared current elements.

For a TDC used within digital phase-locked-loops (DPLL), it can be useful to relate the time reference signal to an oscillation period of either the input clock or a clock generated within the DPLL. In one implementation within a DPLL, the reference time for the TDC relates to the output oscillator period and the input time is related to the phase error between a reference clock event and an event related to the phase of the output oscillator.

As detailed above, the systems and methods described herein provide a circuit and method for achieving low in-band phase noise within a digital phase locked loop (DPLL) through a ratiometric time-to-digital converter (TDC) that performs correlated double sampling (CDS) on the reference signal that is defined by an oscillator period. Advantageously, the TDC described herein can reduce TDC thermal, 1/f, and supply noise in the frequency bands of interest.

A DPLL can offer many advantages in advanced process nodes but normally requires a digitally controlled oscillator (DCO) and a high-performance time-to-digital converter (TDC). TDC quantization, thermal, and 1/f noise often contributes directly to in-band DPLL phase noise. Many TDCs utilize circuit delays such as inverters that are very sensitive to process, supply voltage, and temperature. As such, the overall TDC gain can suffer from poor control of the conversion gain. Although background calibration can be used to compensate for gain variation, this background calibration requires many samples to achieve good accuracy, such that it can only correct for very low-frequency error terms. Since much of the gain error is at higher frequencies, especially supply noise and thermal noise around the PLL bandwidth, significant error spectral content (noise power spectral density) can remain even after TDC gain background calibration.

To address these limitations, the TDCs described herein can perform ratiometric time-to-digital conversion in a DPLL by deriving the reference signal from the oscillator period. Further, the TDCs described herein perform correlated double sampling of the reference noise to achieve first-order reference noise shaping.

As detailed above, the TDCs described herein can define a TDC reference signal as a single sample that relates directly to the DPLL oscillator period, utilizing the same core circuitry to convert both the reference time signal and input time signal into voltage, apply the TDC reference signal in a fractional way to create an estimate signal that is subtracted from the actual TDC input signal, and sample the DPLL reference close in time to the actual input sample such that correlated double sampling benefits can be enhanced.

As detailed above, the circuits, computing devices and systems described and/or illustrated herein broadly represent any type or form of computing device or system capable of executing computer-readable instructions, such as those contained within the modules described herein. In their most basic configuration, these computing device(s) each include at least one memory device and at least one physical processor.

In some examples, the term "memory device" generally refers to any type or form of volatile or non-volatile storage device or medium capable of storing data and/or computer-readable instructions. In one example, a memory device stores, loads, and/or maintains one or more of the modules and/or circuits described herein. Examples of memory devices include, without limitation, Random Access Memory (RAM), Read Only Memory (ROM), flash memory, Hard Disk Drives (HDDs), Solid-State Drives (SSDs), optical disk drives, caches, variations, or combinations of one or more of the same, or any other suitable storage memory.

In some examples, the term "physical processor" generally refers to any type or form of hardware-implemented processing unit capable of interpreting and/or executing computer-readable instructions. In one example, a physical processor accesses and/or modifies one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), systems on a chip (SoCs), digital signal processors (DSPs), Neural Network Engines (NNEs), accelerators, graphics processing units (GPUs), portions of one or more of the same, variations or combinations of one or more of the same, or any other suitable physical processor.

In some implementations, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A time-to-digital converter (TDC) comprising:
    an input voltage circuit configured to translate input time to an input voltage signal;
    a reference voltage circuit configured to translate a reference time to a reference voltage signal;
    a fractional reference voltage circuit configured to output a fractional reference voltage signal corresponding to a fractional portion of the reference voltage signal; and
    a quantizer circuit configured to output a digital value representing a difference between the input voltage signal and the fractional reference voltage signal.

2. The time-to-digital converter of claim 1, wherein the input voltage circuit comprises a first current element and the reference voltage circuit comprises a second current element.

3. The time-to-digital converter of claim 2, wherein:
    the input voltage circuit comprises a first capacitor array coupled to the first current element and the first current element is configured to charge the first capacitor array; and
    the reference voltage circuit comprises a second capacitor array coupled to the second current element and the second current element is configured to charge the second capacitor array.

4. The time-to-digital converter of claim 2, wherein the first current element is the second current element.

5. The time-to-digital converter of claim 1, wherein:
    the fractional reference voltage circuit comprises a primary capacitor array and a sacrificial capacitor array;
    the fractional reference voltage circuit is configured to connect the reference voltage signal to capacitors of the primary capacitor array based on a fractional digital code; and
    the fractional reference voltage circuit is configured to connect the reference voltage signal to capacitors of the sacrificial capacitor array corresponding to capacitors of the primary capacitor array not connected to the reference voltage signal.

6. The time-to-digital converter of claim 5, wherein a capacitance of a capacitor array of the input voltage circuit matches a total capacitance of the connected capacitors of the primary capacitor array and the connected capacitors of the sacrificial capacitor array.

7. The time-to-digital converter of claim 1, wherein the fractional reference voltage circuit is configured to output the fractional reference voltage signal based on a fractional digital code from the quantizer circuit.

8. The time-to-digital converter of claim 1, wherein the quantizer circuit comprises a comparator.

9. The time-to-digital converter of claim 1, wherein the quantizer circuit comprises a successive approximation register (SAR) logic circuit.

10. The time-to-digital converter of claim 1, wherein a second reference voltage signal used by the quantizer circuit to scale quantization is in linear proportion to the reference voltage signal.

11. The time-to-digital converter of claim 1, further comprising a digital-to-analog converter (DAC) circuit comprising a resistor ladder or a bridge capacitor.

12. A device comprising:
a time-to-digital converter (TDC) for receiving an input time and outputting a digital time value, the TDC comprising:
    a time sampling circuit comprising a first current element and a positive primary capacitor array configured to output a time voltage signal;
    a fractional time sampling circuit configured to output a fractional voltage signal and comprising:
        a second current element; and
        a negative primary capacitor array; and
    an analog-to-digital converter (ADC) circuit configured to output a difference between the time voltage signal and the fractional voltage signal as the digital time value.

13. The device of claim 12, wherein the first current element is the second current element.

14. The device of claim 12, wherein the ADC comprises a successive approximation register (SAR) logic circuit that is configured to output a fractional digital code.

15. The device of claim 14, wherein the fractional time sampling circuit further comprises a sacrificial capacitor array and is configured to connect the second current element to capacitors of the negative primary capacitor array corresponding to the fractional digital code and connect the second current element to capacitors of the sacrificial capacitor array corresponding to capacitors of the negative primary capacitor array not connected to the first current element.

16. A method comprising:
translating an input time signal to an input voltage signal for a time-to-digital converter (TDC);
translating a reference time signal to a fractional reference voltage signal; and
quantizing, using an analog-to-digital converter (ADC) of the TDC, a difference between the input voltage signal and the fractional reference voltage signal to a digital word, wherein the digital word comprises a linear function of the input time signal.

17. The method of claim 16, wherein translating the input time signal to the input voltage signal comprises integrating a reference current onto a first capacitor array for an input time corresponding to the input time signal to produce the input voltage signal.

18. The method of claim 17, wherein translating the reference time signal to the fractional reference voltage signal comprises:
integrating the reference current onto a fractional portion of a second capacitor array for a reference time corresponding to the reference time signal to produce the fractional reference voltage signal, wherein a remainder portion of the first capacitor array is not connected to the reference current; and
integrating the reference current onto a portion of a third capacitor array corresponding to the remainder portion of the first capacitor array.

19. The method of claim 18, wherein a capacitance of the first capacitor array is similar to a combined capacitance of fractional portion of the second capacitor array and the portion of the third capacitor array.

20. The method of claim 16, wherein quantizing the difference between the input voltage signal and the fractional reference voltage signal to the digital word comprises providing the ADC a differential output of the input voltage signal and the fractional reference voltage signal.

* * * * *